(12) United States Patent
Kataoka et al.

(10) Patent No.: US 7,588,444 B2
(45) Date of Patent: Sep. 15, 2009

(54) BUSBAR UNIT, ELECTRIC MOTOR AND ELECTROHYDRAULIC POWER STEERING SYSTEM FURNISHED WITH THE BUSBAR UNIT, AND METHOD OF MANUFACTURING THE BUSBAR UNIT

(75) Inventors: Nakaba Kataoka, Kyoto (JP); Yoshihiro Uchitani, Kyoto (JP); Hidehiro Haga, Kyoto (JP); Shuhei Yamashita, Kyoto (JP); Masato Aono, Kyoto (JP)

(73) Assignee: Nidec Corporation, Kyoto (JP)

( * ) Notice: Subject to any disclaimer, the term of this patent is extended or adjusted under 35 U.S.C. 154(b) by 161 days.

(21) Appl. No.: 11/669,949

(22) Filed: Feb. 1, 2007

(65) Prior Publication Data

US 2007/0178723 A1 Aug. 2, 2007

(30) Foreign Application Priority Data

| Feb. 1, 2006 | (JP) | ............................ 2006-024049 |
| Feb. 1, 2006 | (JP) | ............................ 2006-024050 |

(51) Int. Cl.
*H01R 12/00* (2006.01)

(52) U.S. Cl. .................................... 439/76.2

(58) Field of Classification Search ................ 439/213, 439/76.2, 189, 890, 174, 874, 675; 310/68 R, 310/68 B, 67 R, 71, 75 R, 98, 239, 99; 29/622, 29/596, 825
See application file for complete search history.

(56) References Cited

U.S. PATENT DOCUMENTS

| 6,577,029 | B1* | 6/2003 | Weber et al. .............. 310/68 R |
| 6,993,829 | B2* | 2/2006 | Kobayashi et al. ........... 29/622 |
| 2003/0173842 | A1* | 9/2003 | Kobayashi et al. ........... 310/71 |
| 2006/0068617 | A1 | 3/2006 | Migita et al. |

FOREIGN PATENT DOCUMENTS

| JP | H10-014153 A | 1/1998 |
| JP | 2002-252958 A | 9/2002 |
| JP | 2004-048904 A | 2/2004 |

* cited by examiner

*Primary Examiner*—Edwin A. Leon
(74) *Attorney, Agent, or Firm*—Keating & Bennett, LLP

(57) ABSTRACT

A busbar unit for attachment to on an electric-motor armature is furnished with: busbars having terminals for supplying drive current to the armature; a plurality of connecting pins each of approximately J-shaped metal; a busbar holder retaining the busbars and the connecting pins; and a circuit board disposed on the upper side of the busbar holder, and in which a sealant injection port and an air-bleeding hole are formed.

19 Claims, 15 Drawing Sheets

BUSBAR UNIT, ELECTRIC MOTOR AND ELECTROHYDRAULIC POWER STEERING SYSTEM FURNISHED WITH THE BUSBAR UNIT, AND METHOD OF MANUFACTURING THE BUSBAR UNIT

BACKGROUND OF THE INVENTION

1. Technical Field

The present invention relates generally to busbar units and technologies in electric motors in which busbar units are employed.

2. Description of the Related Art

In recent years, electric motors are being exploited as a power source for a variety of automobile machinery such as power steering and throttle valves. In the motors, electronic parts of various kinds are mounted on circuit boards in order to realize high-precision control. Given that long-term, precision operation under various environments is being demanded of automobiles, advanced reliability is in turn being demanded of motors as one component of automobile machinery.

In electric motors, electronic parts such as coil terminal wires and sensor elements are connected to a busbar or circuit board provided on the coil end of an armature. In the electric motor taught in Japanese Unexamined Pat. App. Pub. No. H10-14153, for example, coil terminal wires and a speed detecting sensor are connected to a board on which a support piece is mounted, and additionally, a connector jack is joined onto the board, wherein connection between the board and lead wires for an external power source is made via the connector, and signals from the speed-detecting sensor are brought to the exterior via the connector as well.

In recent years, motor-employing electric power steering (EPS) has been attracting attention as an efficient system in that engine power loss is slight compared with hydraulic power steering, in which engine output is directly transferred to the steering fluid. Motors employed in EPS include machines exploited as a power source for fluid-delivering pumps that operate with the motor interior being filled with fluid. Implementations in which the motor interior is fluid-filled, however, risk giving rise to electrical hazards such as short circuiting should metal powder get mixed into the fluid for some reason.

Moreover, with electric motors such as set forth in the foregoing reference, in implementations in which the pins inside the connector jack are joined directly to the circuit board, the force acting on the pins when the jack is coupled to and decoupled from an external plug is transmitted directly to the circuit board, which runs the risk that the stress arising in the coupling/decoupling force will lead to damage to the joint between the pins and the circuit board, or to cracks in the circuit board.

BRIEF SUMMARY OF THE INVENTION

A busbar unit of the present invention is composed of: a busbar holder, molded of a non-conductive resin material, in which are retained approximately J-shaped connecting pins and a busbar having terminals; and a circuit board fixed to the upper side of the busbar holder.

A receiving niche is formed along the upper side of the busbar holder in a location corresponding to the circuit board. A sealant is charged into the space thus defined by the circuit board and the receiving niche, with electronic components being mounted on the circuit board in the location corresponding to the receiving niche. Accordingly, even if the busbar unit is to be immersed in a hydraulic fluid, inasmuch as the electronic components on the circuit board are sealed by the sealant, short circuiting can be prevented.

Moreover, because approximately J-shaped, the connecting pins apart from their both ends, which are the connector-side and board-side ends, are partially contained in the busbar holder. As a result, the busbar holder absorbs the force exerted on the connecting pins when the external jack is coupled to the connector-side end to prevent the circuit board from being stressed via the board-side end.

From the following detailed description in conjunction with the accompanying drawings, the foregoing and other objects, features, aspects and advantages of the present invention will become readily apparent to those skilled in the art.

DETAILED DESCRIPTION OF THE INVENTION

Figure 1:
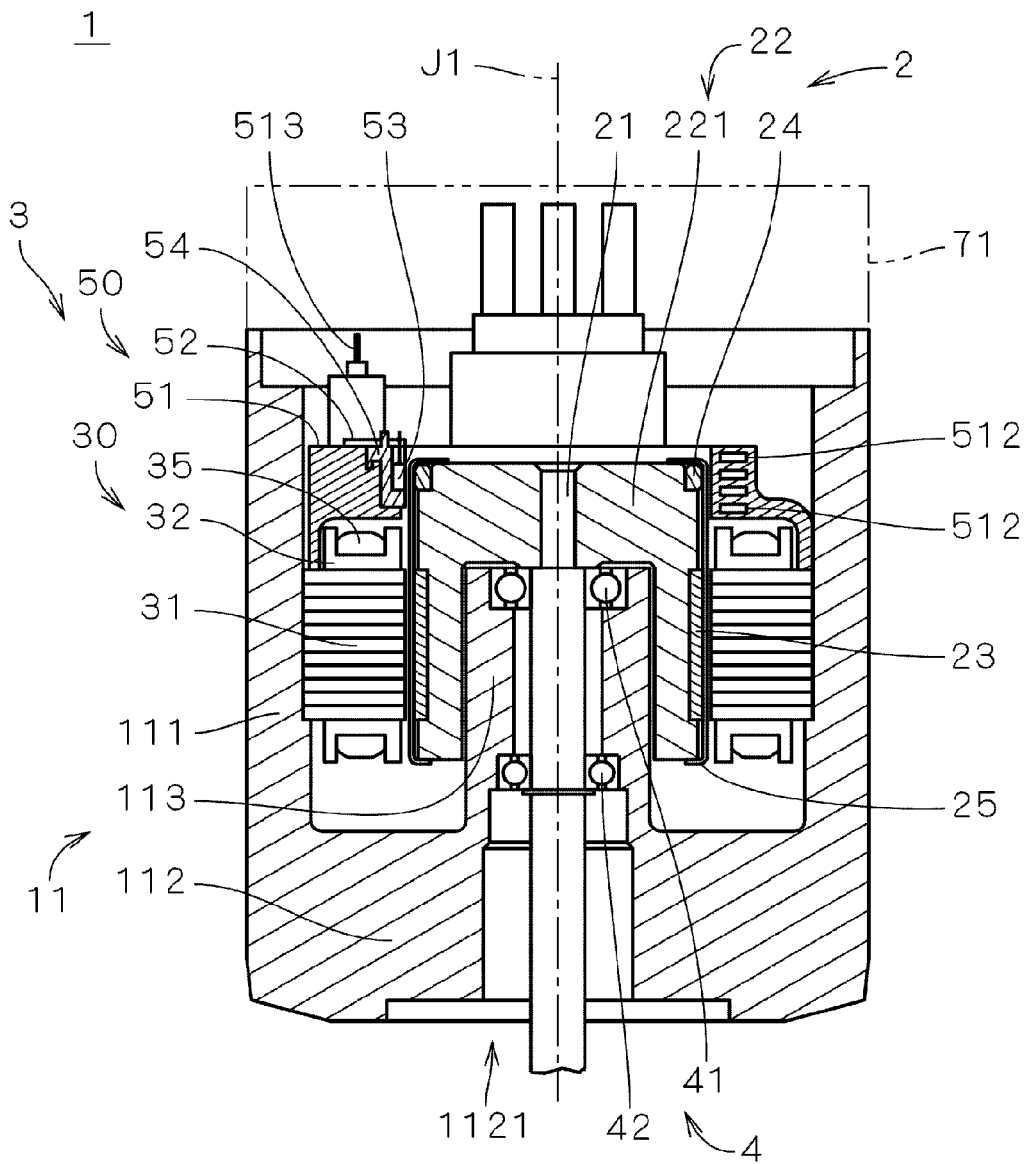
FIG. 1 is a schematic sectional view taken axially, illustrating one mode of embodying the present invention, with a control circuit indicated in phantom.

Reference is made to FIG. 1, a vertical cross-sectional view illustrating an electric motor 1 involving a first embodiment of the present invention. The motor 1, which is a so-called brushless motor, is for example installed as a drive source in an electrohydraulic power steering system for assisting the steering of an automobile. It is to be noted that, in the shaded area of the cross-sectional view, the illustrations of details are partially omitted. The motor 1 is furnished with: a rotor section 2, which is a rotary assembly; a stator section 3, which is a stationary assembly; an approximately cylindrical bottomed housing 11 containing the rotor section 2 and the stator section 3; and a bearing mechanism 4.

When the motor 1 is actually used, an opening on the upper side of the housing 11 in FIG. 1 is separately covered with a lid member, on which a control circuit unit 71 (hereinafter referred to as an ECU [electronic control unit]) is mounted. Additionally, a pump is mounted on the outside of the bottom of the housing 11, and power-steering fluid fills the pump and the housing 11. In the following explanation, for convenience, the opening side of the housing 11 is referred to the upper side and the bottom side of the housing 11 is referred to as the lower side, with respect to the orientation in which a center axis J1 extends. The center axis J1, however, does not necessarily have to coincide with the direction of gravity.

The housing 11 is furnished with: an approximately cylindrical tubular section 111 centered on the center axis J1 and formed by aluminum die casting as a single component; a bottom portion 112 covering the lower end of the tubular section 111 and having an aperture 1121 formed in the center of the bottom portion 112; and an approximately cylindrical bearing retaining portion 113 protruding from the aperture 1121 along the center axis J1 toward the upper end of the tubular section 111.

The rotor section 2 is furnished with: a shaft 21 one end (the upper end) of which protrudes, centered on the center axis J1, from the end of the bearing retaining portion 113; a rotor core 22 provided with a cylindrical portion centered on the center axis J1 and mounted on the shaft 21 at the upper end of the shaft 21; a field magnet 23 mounted on the lateral side of the rotor core 22; an annular sensor magnet 24 centered on the center axis 24 and mounted on the outer peripheral surface of the upper end of the rotor core 22; and a rotor cover 25 covering the field magnet 23 and the sensor magnet 24.

The rotor core 22 is a magnetic body shaped in the form of a capped cylinder covering the end of the bearing retaining portion 113, and produced by a manufacturing process that includes pressure-molding and sintering a powdered metal material. The cap portion 221 on the upper part of the rotor core 22 is connected to the upper end of the shaft 21, with the rotor-core lower side being a free end. In this way supporting the rotor core 22 with a so-called cantilever structure locates the bearing mechanism 4 inside the rotor core 22 to realize a reduction in the height (axial length) of the motor 1. It will be appreciated that the entire bearing mechanism 4 does not have to be located in the rotor core 22 interior; at least only a portion of the bearing mechanism 4 may lie within the rotor core 22.

The field magnet 23, which is an assembly of a plurality of field magnetic elements elongated parallel to the center axis J1 (a so-called segment magnet), is arranged circumferentially on the outer peripheral surface of the rotor core 22. As the field magnet 23, for example, a sintered compact containing neodymium is employed.

An armature 30 is mounted on the inner peripheral surface of the tubular section 111 of the housing 11 so as to oppose to the field magnet 23, and the center axis of the armature 30 coincides with the center axis J1 of the shaft 21. The armature 30 is furnished with: a plurality of teeth (cf. reference numeral 311 in FIG. 2) disposed radiating toward the center axis J1 from the inner peripheral surface of an annular portion (so-called core back) of a core 31 consisting of a magnetic part, with the fore ends of the teeth directed toward the center axis J1 (that is, the teeth extend from the inner peripheral surface of the housing 11 toward the shaft 21 and the field magnet 23); insulators 32 covering the plurality of teeth; and coils 35 provided by winding a conductor in multiple layers over the insulators 32 onto the plurality of teeth. The coils 35 are formed by wrapping the conductor vertically (in the center axis J1 orientation) onto the outer periphery of the teeth and the insulators 32.

A busbar unit 50, with which electrical link for supplying drive current to the coil 35 of armature 30 is established, is disposed on the upper side—that is, a first side of the armature 30 with respect to the orientation of the center axis J1—and the busbar unit 50 is connected also to the ECU 71. The busbar unit 50 is furnished with: the approximately circular busbar holder 51 created by injection-molding of a non-conductive resin material; a plurality of arcuate busbars 512 (four in the present embodiment) stacked spaced inside the busbar holder 51 in the orientation of the center axis J1; and a plurality of approximately linear metal connecting pins 513 individually possessing stiffness. A circuit board 52 is disposed on the upper side of the busbar unit 50.

In the motor 1, the stator section 3 secured in the housing 11 is configured with mainly the armature 30 and the busbar unit 50, and the bearing mechanism 4 is retained inside the bearing retaining portion 113 of the housing 11. The bearing mechanism 4 is composed of a pair of bearings 41, 42 arranged parallel to the center axis J1 and the shaft 21 of the rotor section 2 is retained by the pair of bearings 41, 42 inside the bearing retaining portion 113, so that resultantly the rotor section 2 is supported so as to rotate relatively on the center axis J1 with respect to the stator section 3. And, when the armature 30 is supplied with drive current via the busbar unit 50, torque centered on the center axis J1 develops between the field magnet 23 and the armature 30 to allow the rotor section 2 to rotate.

Three Hall elements 53, which are sensors for detecting the orientation of the rotor core 22 (that is, the position where the rotor section 2 rotates) together with various electronic components, is connected to the busbar holder 51 side of the circuit board 52 so as to project downwards, and the Hall elements 53 are held by a sensor holder 54 described hereinafter. The Hall elements 53 are disposed on the outside of the sensor magnet 24 with respect to the center axis J1 so that the sensor magnet 24 is opposed to the hall element 53. Because the sensor magnet 24 is multipolarized as is the field magnet 23, the Hall elements 53 detect the magnetic field of the sensor magnet 24, with the result that the position where the field magnet 23 rotates is indirectly detected. And then, drive current for the armature 30 is controlled depending on the detected result.

Figure 2:
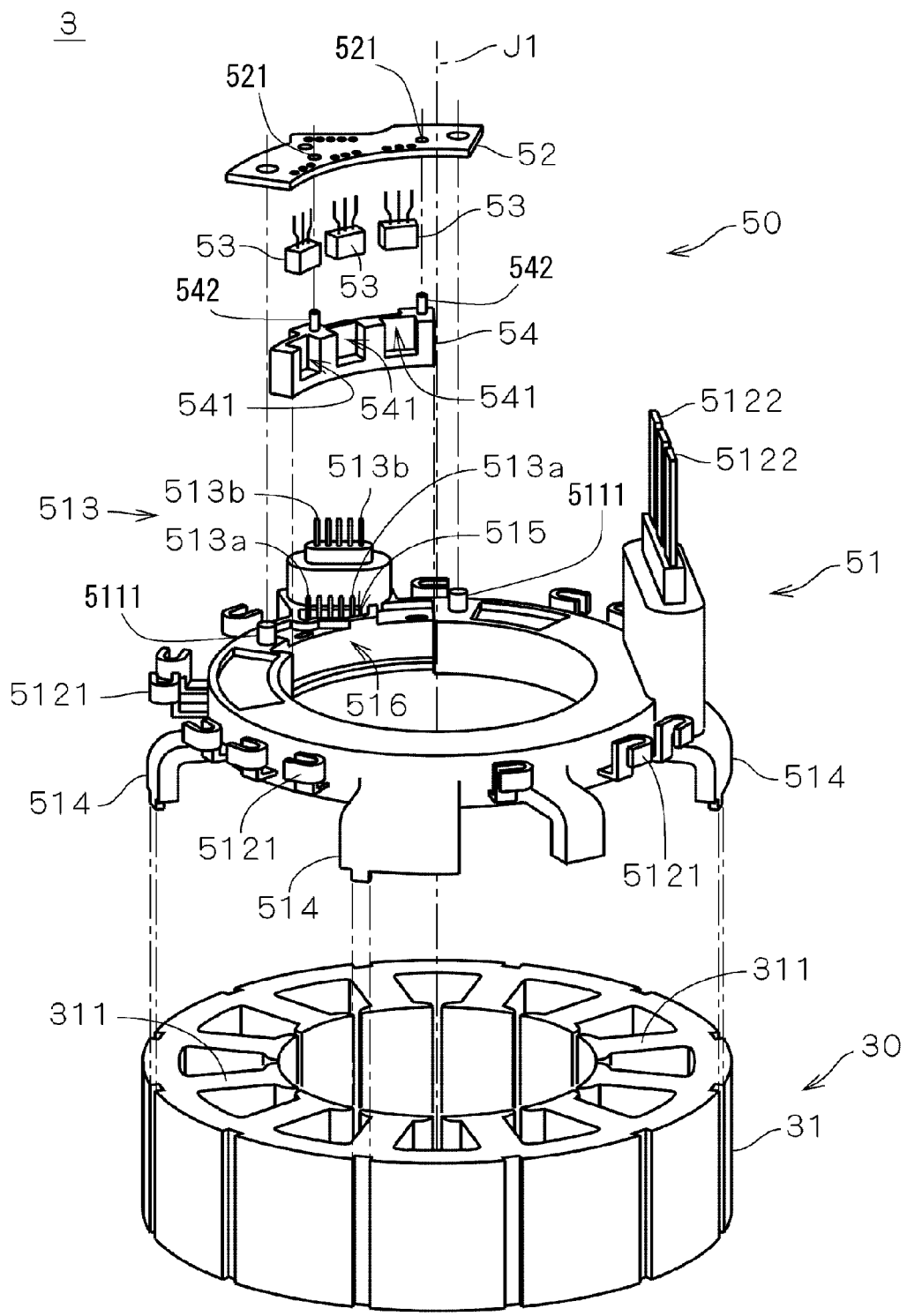
FIG. 2 is an exploded oblique view illustrating principal constituent elements of a stator of the present invention.

FIG. 2 is a perspective view illustrating disassembled major components of the stator section 3. With regard to the armature 30, FIG. 2 illustrates only the core 31. When the busbar unit 50 is mounted on the upper end of the armature 30, however, an actual armature 30 is prepared by covering the teeth 311 of the core 31 with the insulator 32, on which additionally a conductor is wound to form the coil 35 (refer to FIG. 1).

As illustrated in FIG. 2, the busbars 512 (refer to FIG. 1) in the busbar unit 50 are provided with a plurality of terminals 5121 for establishing connection with the armature 30 and a plurality of flat terminals 5122 for establishing connection with an external electric current supplying section, and are resin-molded so that regions for making connection with the terminals 5121 and with the terminals 5122 lie inside the busbar holder 51 through insert-molding in injection-molding. In addition, the busbar unit 50 is further provided with a plurality of connecting pins 513 for external connection, and resin-molded so that the connecting pins 513 apart from their both ends 513a, 513a lie also inside the busbar holder 51 through insert-molding in injection-molding. In this way, two main types of metal members are disposed inside the busbar holder 51 of the busbar unit 50 so that a plurality of busbars 512, which are first metal members, and a plurality of connecting pins 513, which are second ones, are partially covered by busbar holder 51. Therefore, these two metal members are secured electrically insulated from each other.

In the stator section 3, swaging or welding the conductor of the coil 35 whose illustration is omitted to the outer peripheral terminals 5121 permits the busbar unit 50 to be electrically connected to the armature 30. Therein, a plurality of feet 514 provided on the outer peripheral of the busbar holder 51 abuts on the top side of the core 31, and moreover projections formed on the end of the feet 54 fit into the longitudinal grooves in the outer peripheral surface of the core 31, so that the axial and circumferential position of the busbar unit 50 with respect to the core 31 can be determined.

Figure 3:
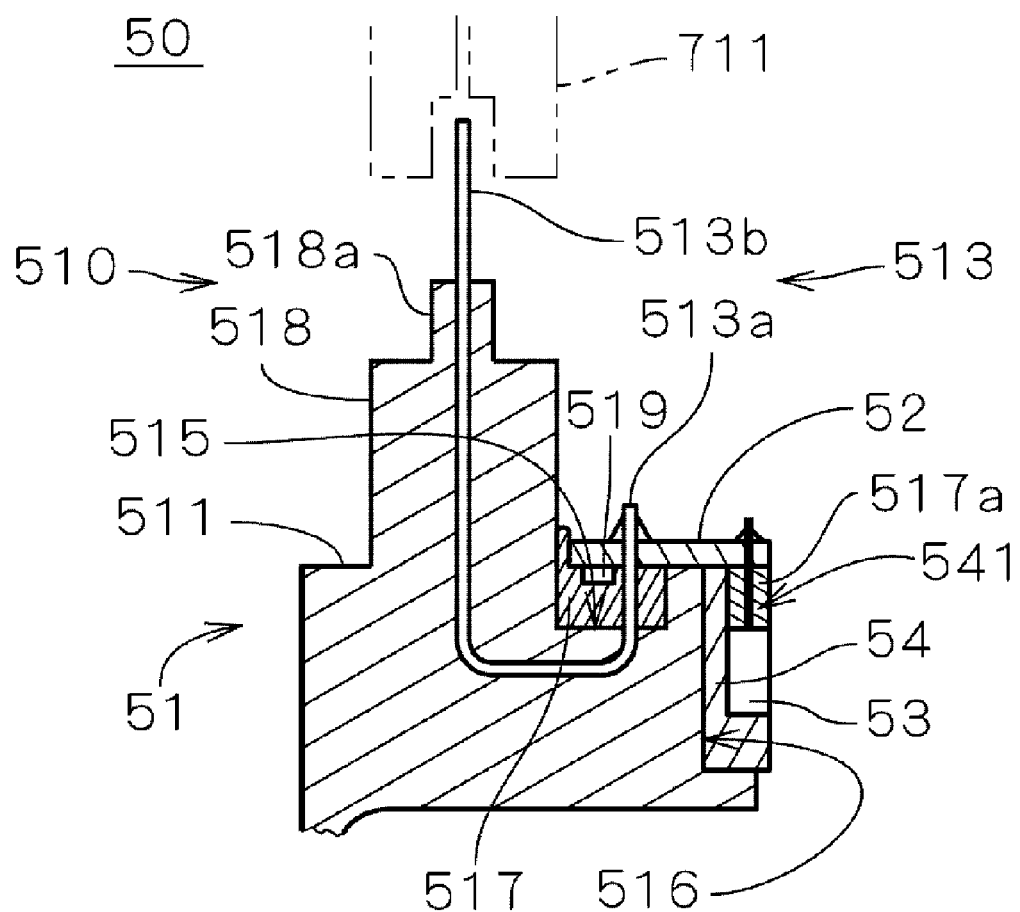
FIG. 3 is a schematic, fragmentary, enlarged sectional view taken axially, illustrating a portion of a busbar unit of the present invention, with an external jack represented in phantom.

FIG. 3 is a vertical cross-sectional view illustrating the partially enlarged busbar unit 50. In the busbar unit 50, because connecting pins 513 are approximately J-shaped, their both ends 513a, 513b protrude upwards from the busbar holder 51. Of the two ends of the connecting pins 513, the ends 513a (hereinafter referred to as the board-side ends) that are joined to the circuit board 52 protrude perpendicularly from a surface of the busbar holder 51 that opposes the circuit board 52, as illustrated in FIG. 2 and FIG. 3; and the ends 513b (hereinafter referred to as the connector-side ends) on the side of the connecting pins 513 opposite from the circuit board, protrude upwards further from the end of a projection 518 provided on the busbar holder 51 so as to jut out upwards.

As noted above, in the present embodiment the busbar holder 51 retains four arcuate busbars stacked spaced apart vertically. Therein, it will be appreciated that each busbar may be broken circumferentially, provided in discrete arcuate segments, wherein the inter-end bends in the J-shaped connecting pins may lie in between the respective ends of the busbar segments, extending axially deeper into the busbar holder 51, while still remaining electrically insulated from the busbar segments themselves.

In particular, the end of the projection 518 is provided with a connector protrusion 518a protruding upwards surrounding a plurality of connector-side ends 513b, which are stuck out through the end of the connector protrusion 518a. Subsequently, an external connector for outputting signals to the ECU 71 (refer to FIG. 1) is reattachably coupled to a holder connector 510 including the connector protrusion 518a and connector-side ends 513b. That is, in the busbar unit 50, a region, surrounding the connector-side ends 513b, of the busbar holder 51 is integrated into the board side connector 510 coupled to the external connector 711. The signals output to the ECU 71 are generated by an electronic part 519, as described hereinafter, mounted on the circuit board 52, depending on the signals from the Hall elements 53. Thus, connecting the ECU 71 directly to the busbar 51 facilitates assembling the motor 1.

As illustrated in FIGS. 2 and 3, an arcuate recess 516 for accommodating the arcuate sensor holder 54 molded of a resin member is created on the inner peripheral surface of the busbar holder 51. When the Hall elements 53 are mounted to the circuit board 52, they are inserted into the recesses 541 to be held, and the terminals of the Hall elements 53 are inserted into holes created in a land formed on the top surface of the circuit board 52 before the sensor holder 54 is secured on the busbar holder 51 side of the circuit board 52. As illustrated in FIG. 2, the sensor holder 54 is secured on the circuit board 52 by thermal welding, in which the protrusions 542 of the sensor holder 54 are inserted into holes 521 of the circuit board 52, and then the protrusion 542 are melted by heating to be crushed. After that, the terminals of the Hall elements 53 are joined to the circuit board 52 by soldering.

The circuit board 52 is secured to the busbar holder 51, after the sensor holder 54 is mounted to the circuit board 52. First, the sensor holder 54 is fitted into the recess 516, and then projections 5111, which are two resin members provided integrally on the top side of the busbar holder 51, are inserted into holes 522 of the circuit board 52 and simultaneously the board-side ends 513a of the plurality of connecting pins 513 are inserted into holes 523 provided in the circuit board 52. Subsequently, the circuit board 52 is rigidly secured to the busbar holder 51 by thermal-welding, in which the projections 5111 are melted by heating to be crushed. Furthermore, the board-side ends 513a are joined to the circuit board 52 by soldering. It is to be noted that in the busbar unit 50, making the board-side ends 513a stick out vertically from the surface of the busbar holder 51 facilitates joining the connecting pins 513 to the circuit board 52.

In the busbar unit 50, as illustrated in FIG. 3, the connecting pins 53 is stuck out vertically from one of the surfaces of the busbar holder on the side opposed to the circuit board 52, that is, the bottom surface of the receiving niche 515, to expose the board-side ends 513a, which are electrically connected by soldering to the circuit board 52 abutting on the busbar holder 51 so as to cover the receiving niche 515. As a result, the portion of the connecting pins 513 between the circuit board 52 and the busbar holder 51 is contained in the receiving niche 515 to be covered with a sealant 517. Therefore, the connecting pins 513 are secluded from the oil in the motor 1 even between the circuit board 52 and the busbar holder 51, so that in the event that metal powder gets mixed in the oil, electric troubles are prevented. Moreover, as referred to hereinafter, a sealant is applied to the other parts of the busbar holder 51 and the circuit board 52 as appropriate. Especially as illustrated in FIG. 3, a sealant 517a is charged into the space between the Hall elements 53 and the circuit board 52.

In addition, the electronic component 519 is mounted on the surface of the circuit board on the side opposite to the busbar holder 51, and the receiving niche 515 also contains the electronic component 519. Therefore, the electric component 519 is readily sealed.

While the foregoing has described the construction of the motor 1, in the busbar unit 50 of the motor 1, the connecting pins 513 apart from the board-side ends 513a and the connector-side ends 513b are partially molded of resin so as to lie inside the busbar unit 51, whereby the board-side ends 513a are joined to the circuit board 52. Therefore, when the external connector 711 is coupled to the connector-side ends 513b, the busbar holder 51 absorbs the force acting on these ends to prevent the force from acting on the board-side ends 513a. As a result, stress is prevented from developing in the joints on the board-side ends 513a and in the circuit board 52 to prevent the joints and circuit board 52 from being damaged. Especially, forming the feet 514 integrally on the position, circumferentially corresponding to the holder connector 510, of the busbar holder 51 reduces the stress applied to the busbar holder 51 when the external connector 711 is coupled. Likewise, forming the feet 514 at the position where the plurality of flat terminals 5122 for establishing connection with the external electric current supply source are formed reduces the stress applied to the busbar holder 51. Furthermore, making the connecting pins 513 approximately J-shaped allows the circuit board 52 to be disposed adjacent to the holder connector 510, instead of the position paralleling the orientation in which the external connector 711 is coupled (that is, below the connector-side ends 513b), so that the busbar holder 51 efficiently absorbs the force acting on the connecting pins 513 when the external connector 711 is coupled and decoupled to further prevent the force from acting on joints on the board-side ends 513a, and on the circuit board 52.

Moreover, because the connecting pins are approximately J-shaped, they are readily exposed so as to bare board-side ends 513a from the same surface of the busbar holder 51, allowing ready joining of the connecting pins 513 to the circuit board 52.

On the other hand, in the busbar unit 50, the region (the connector protrusion 518a), surrounding the connector-side ends 513b, of the busbar holder 51 and the connector-side ends 513b are integral parts of the holder connector 510 coupled to the external connector 711 (the connector 510, which actually provided with packing, may be configured almost only with the connector protrusion 518a and the connector-side ends), so that the need to mount different connectors to the busbar holder 51 is eliminated, simplifying the structure and assembly of the busbar unit 50.

It is to be noted that, with the motor 1 is as mentioned earlier being employed as the source of pumping power for a hydraulic-fluid delivery pump, because the housing 11 interior is filled with the fluid, a sealant is applied as appropriate to the joints between the circuit board 52, and the busbar-unit 50 terminals, the Hall elements 53, and other electronic parts.

Figure 4:
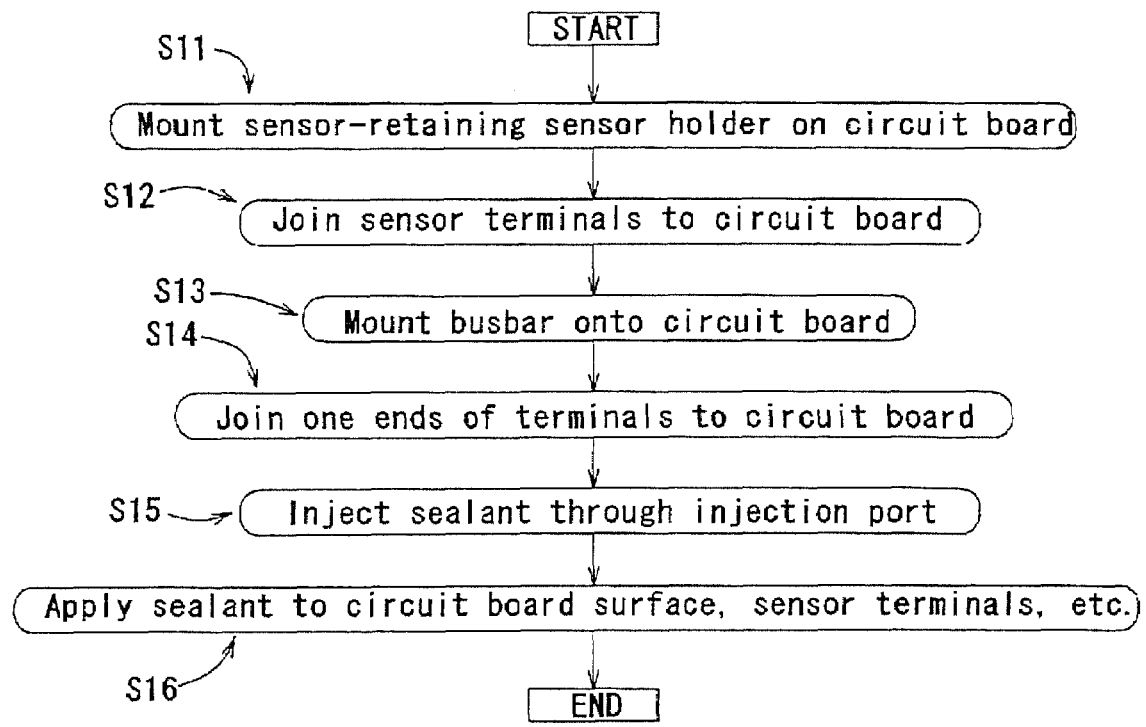
FIG. 4 is a chart setting forth flow in the manufacture of a busbar unit of the present invention.
Figure 5:
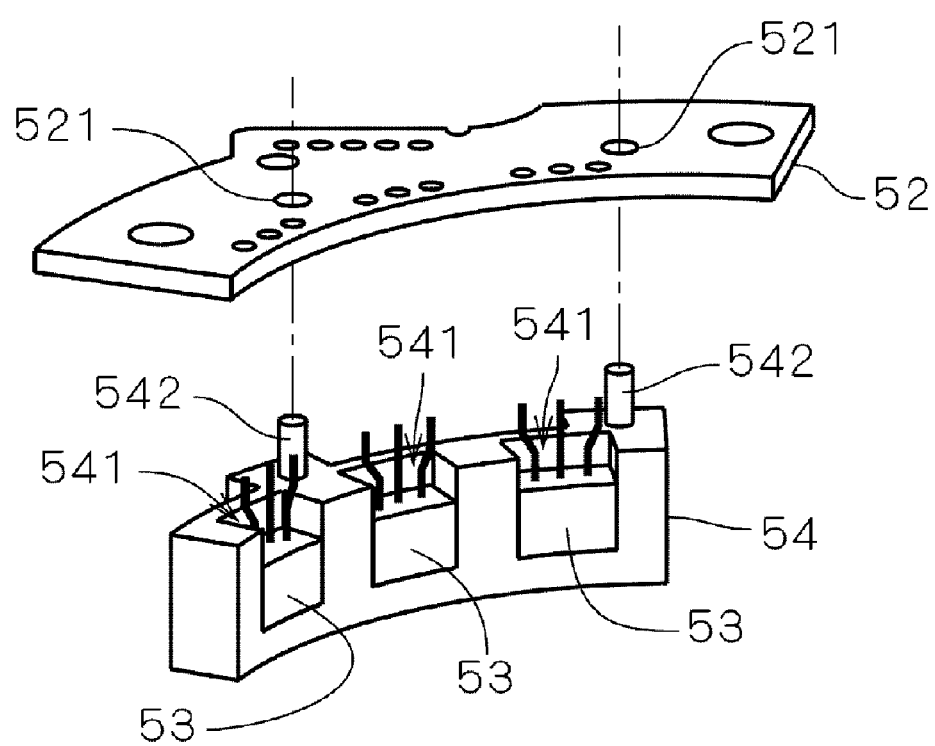
FIG. 5 is a schematic oblique view illustrating a circuit board going onto a sensor holder in the course of manufacturing a busbar unit of the present invention.
Figure 6:
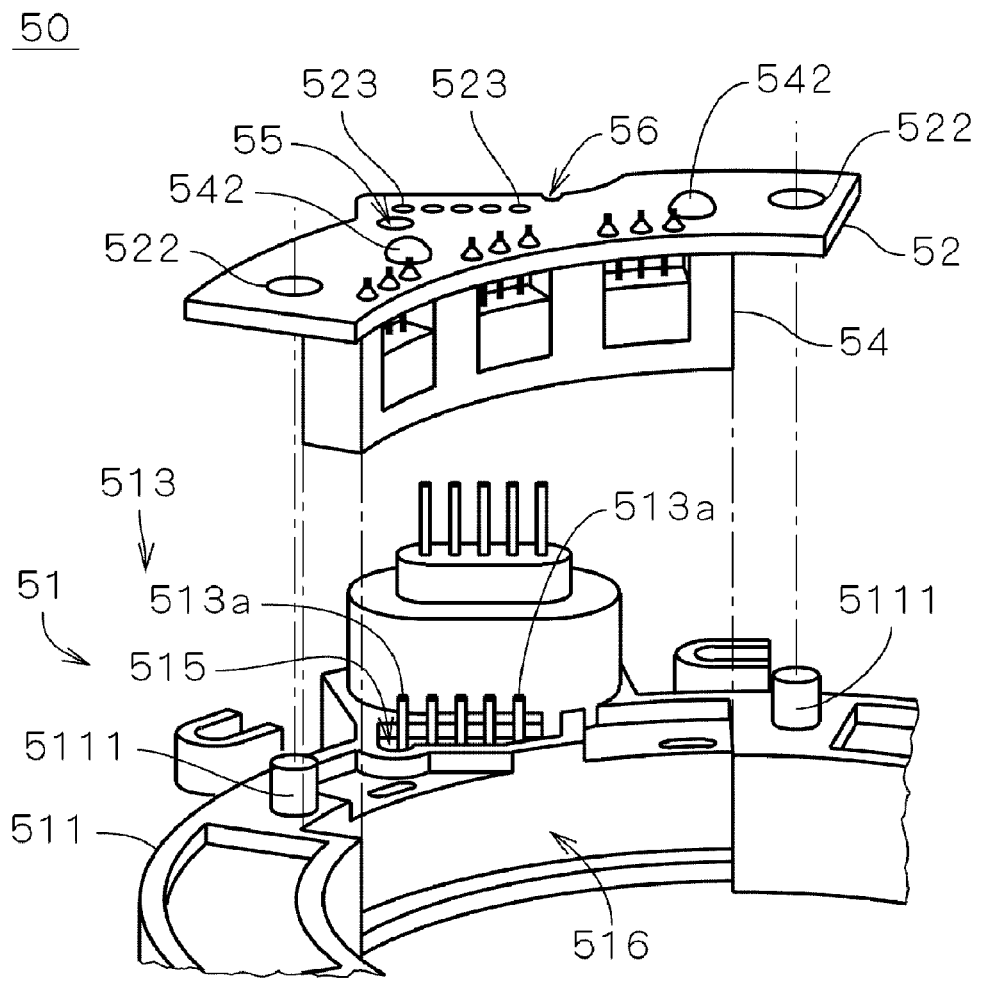
FIG. 6 is a schematic oblique view illustrating the sensor holder with the circuit board fixed onto it, going into a receiving niche in a busbar holder, represented fragmentarily, in the course of manufacturing a busbar unit of the present invention.

Next, the manufacturing method of the busbar unit 50 employed to the motor 1 will be explained. FIG. 4 represents a flow of manufacturing the busbar unit 50 and FIG. 5 through FIG. 9 illustrate the process of manufacturing the busbar unit 50. To manufacture the busbar unit 50, as illustrated in FIG. 5, first, the Hall elements 53 (sensors) are inserted into the recesses 541 of the sensor holder 54 to be held, and the terminals of the Hall elements 53 are inserted into the hales created in the land formed on the circuit board 52 before the sensor holder 54 is mounted on the busbar holder 51 side (refer to FIG. 2) of the circuit board 52. The sensor holder 54 is secured to the circuit board 52, as illustrated in FIG. 5 and FIG. 6, by thermal welding, in which the projections 542 of the sensor holder 54 are inserted into the holes 521 of the circuit board 52, and are melt by heating to be crushed (Step S11). Subsequently, the terminals of the Hall elements 53 are joined to the circuit board 52 (Step S12) by soldering. It will be appreciated that the sensor holder 54 may be secured to the busbar holder 51 or to both the circuit board 52 and the busbar holder 51.

Figure 9:
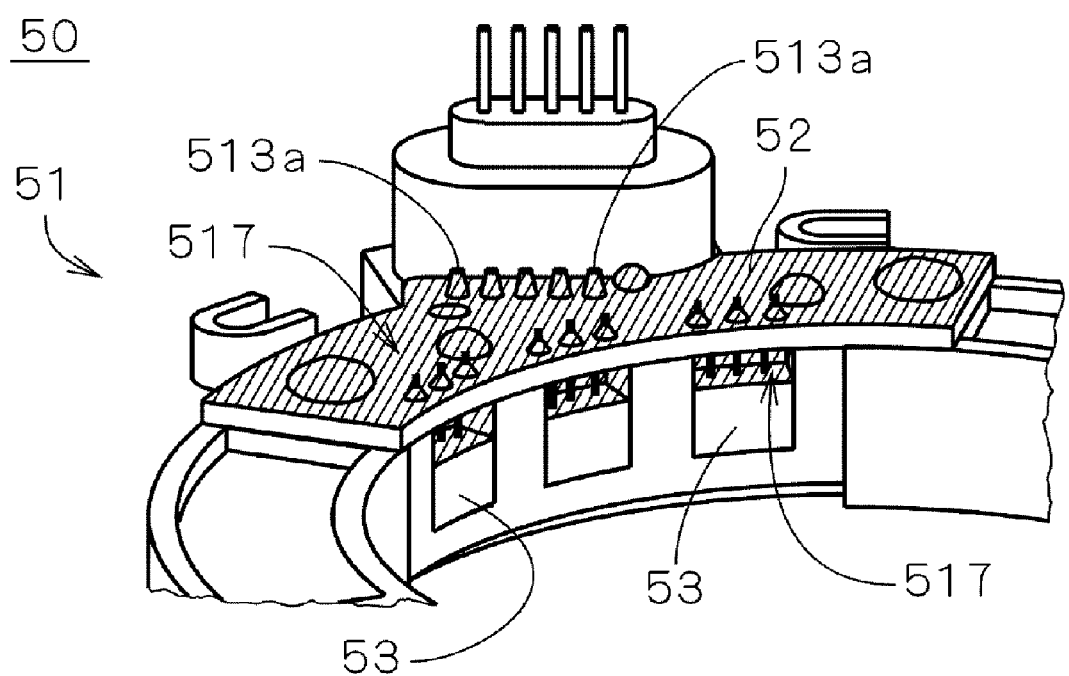
FIG. 9 is a schematic oblique view illustrating the sensor-holder and circuit-board assembly fitted into the recess in a busbar holder in the course of manufacturing a busbar unit of the present invention, wherein the busbar holder is represented fragmentarily and the hatching indicates sealant.

After that, as illustrated in FIG. 6, the sensor holder 54 is fitted into the recess 516, and then the circuit board 52 is mounted on the busbar 51 by inserting the projections 5111 on the top side of the busbar holder 51 into the holes 522 of the circuit board 52 and simultaneously inserting a plurality of the board-side ends 513a of the connecting pins 513 into the holes 523 created in the circuit board 52. Subsequently, as illustrated in FIG. 9, the circuit board 52 is rigidly secured on the busbar holder 51 by thermal welding, in which the projections 5111 are melted by heating to be crushed (Step S13). Additionally, the board-side ends 513a are joined to the circuit board 52 (Step S14) by soldering.

As described in the foregoing, in that the motor 1 is employed as the power source for a hydraulic-fluid delivery pump, the housing 11 interior is fluid-filled. Therefore, next, the terminals 5121 (cf. FIG. 2) or the joints between the Hall elements 53 and the terminals of other electronic components on the circuit board 52 are subjected to a sealing process as appropriate.

In the sealing process, first, sealing the space defined by the circuit board 52 and the busbar holder 51 is carried out. In circuit board 52, as illustrated in FIG. 6, a though hole is created as an injection port 55 from which the sealant 517 is injected and a notch is created independently from the injection port 55 as an air-bleeding hole 56. The injection port 55 and the air-bleeding hole 56 are provided in the circuit board 52 so as to be opposed to the receiving niche 515 furnished on the top side of the busbar holder 51. More precisely, a part of the receiving niche 515 and a notch 525 are combined to form the air-bleeding hole 56 for the receiving niche 515. The air-bleeding hole 56 is employed mainly to discharge air from the receiving niche 515, while it is employed incidentally to check the extent of charging of the sealant 517.

Figure 7:
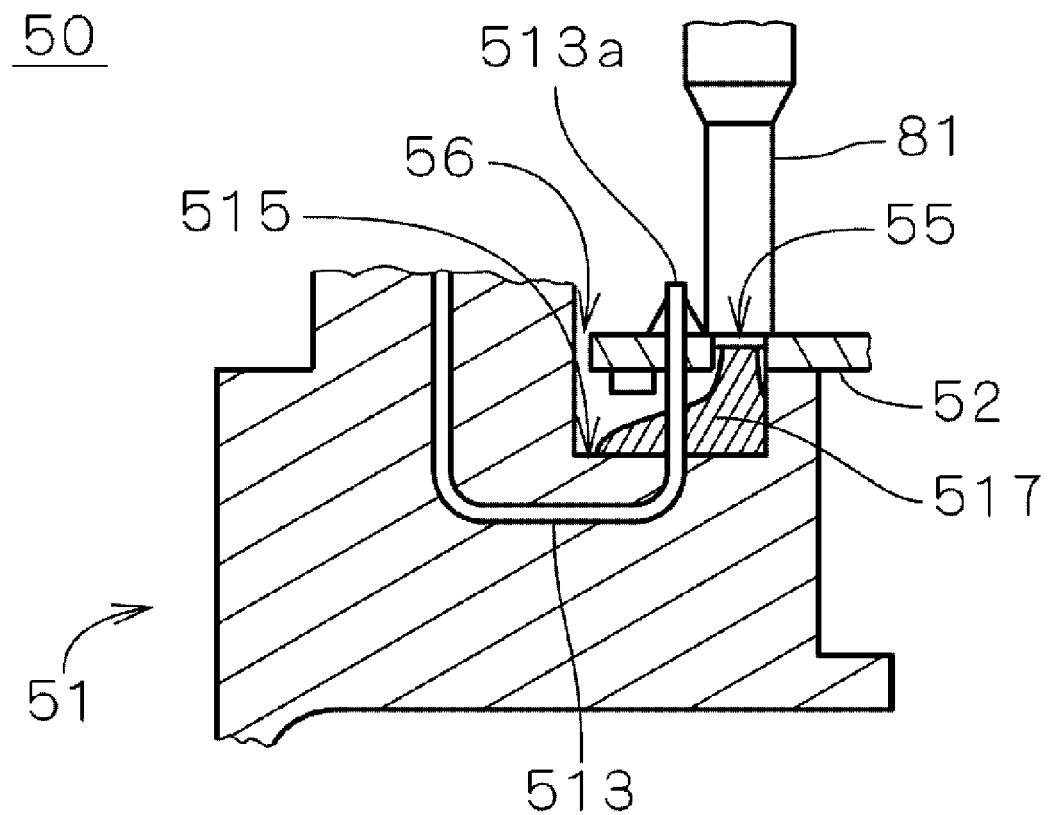
FIGS. 7 and 8 are views of the busbar unit portion in FIG. 3, but further fragmented and enlarged, representing the injection of a sealant through an injection nozzle, depicted fragmentarily, into the receiving niche in the course of manufacturing a busbar unit of the present invention.
Figure 8:
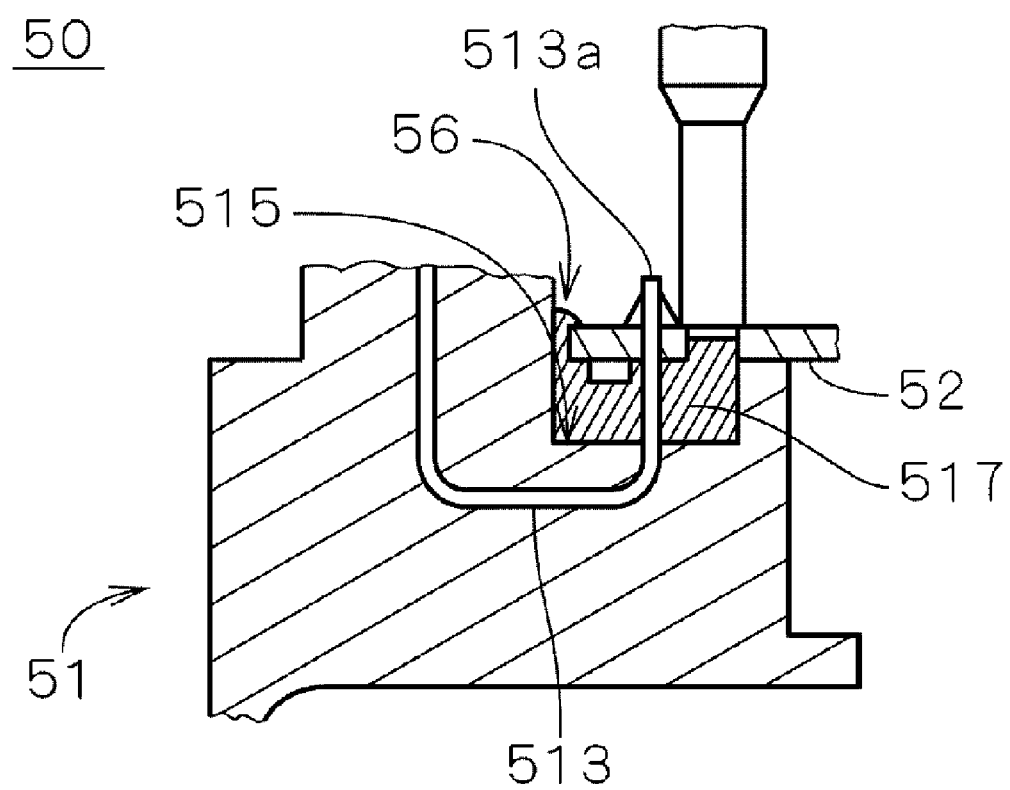

FIGS. 7 and 8 illustrate the process of injecting the fluid sealant 517 into the receiving niche 515. When the sealant 517 is injected, a nozzle 81 is pressed against the injection port 55 and the sealant 517 is discharged through the nozzle 81 to inject the sealant 517 into the receiving niche 515 defined by the circuit board 52 and the busbar holder 51 (Step S15). As a result, air in the receiving niche 515 escapes readily from another opening as the air-bleeding hole 56, so that the sealant is efficiently charged and the sealing is properly carried out. On the other hand, injecting the sealant 517 is stopped immediately as soon as it is confirmed that sealant 517 is charged to reach the air-bleeding hole 56. Therefore, a proper amount of the sealant 517 is charged in the proper area. Because the sealant 517 is self-curing, it hardens when left standing for an appropriate period of time. For this reason, a region of the connecting pins 513 in the space defined by the circuit board 52 and the busbar holder 51 (and, along the busbar-holder 51 side of the circuit board 52, the joints between the circuit board 52 and the board-side ends 513a) is securely isolated electrically from the oil injected into the motor 1 in the later process.

When sealing process for the space defined by the circuit board 52 and the busbar holder 51 is complete, as illustrated in FIG. 9, the sealant is applied to the surface of the circuit board 52 on the side opposite to the busbar holder 51 to seal the joints between the board-side ends 513a and the terminals of Hall elements 53 on the circuit board 52 (that is, these parts are coated). Additionally, the sealant 517 is applied also to the lower side of the Hall elements 53 than the circuit board 52 and, as appropriate, to other regions such as the terminals 5121 of the busbar holder 51. After that, the sealant hardens, when manufacturing the busbar 50 is complete (Step S16). In FIG. 9, the illustration of the sealant applied in Step S16 is omitted and parallel slant lines and code 517 represents the area in which the sealant is applied.

It should be understood that, of areas in the space defined by the circuit board 52 and the busbar holder 51, the area to which the sealant is possibly applied before the circuit board 52 is mounted on the busbar holder 51 (for example, the electrodes of a surface-mounted electric component) may be applied with the sealant 517 previously before the circuit board 52 is mounted on the busbar holder 51.

As described in the foregoing, in the motor 1, the sealant 517 is injected from the injection port 55 provided in the circuit board 52, so that the space defined by the circuit board 52 and the busbar holder 51 (especially, the portion of the connecting pins 513 in this space) is sealed by the sealant 517 without difficulty even after the circuit board 52 is secured to the busbar holder 51 to prevent electric troubles such as short circuit from occurring in the event that metal powder accidentally get mixed in the oil around the joints between the connecting pins 513 on the circuit board 52, improving the reliability of the motor 1.

Moreover, forming the receiving niche 515 into which the sealant 517 is charged, in the side, opposite to the circuit board 52, of the busbar holder 51 facilitates sealant charging into the desired area. And, providing the circuit board 52 with the air-bleeding hole 56 not only facilitates the charging of the sealant 517, but also and makes it possible to check to where the sealant 517 reaches, improving the workability, so that sealing is properly carried out.

Figure 10:
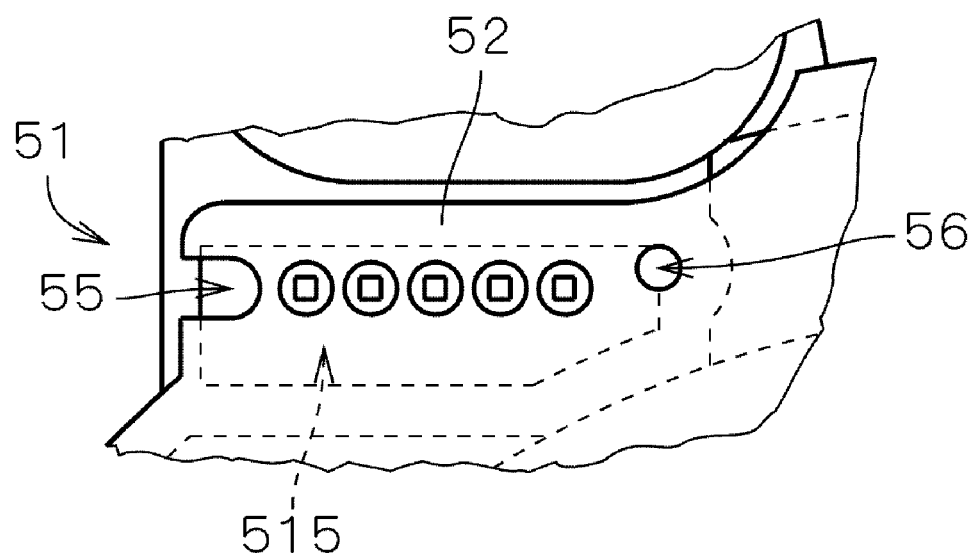
FIGS. 10 and 11 are fragmentary, enlarged plan views, seen from overhead, illustrating a portion of a busbar unit in respective further embodiments of the present invention.

Next, another preferred example of the busbar unit 50 will be described. FIG. 10 is a plan view illustrating a part of an enlarged busbar unit 50a involving the further example. In the busbar unit 50 illustrated in FIG. 6, while a through-hole is create as the injection port 55 in and a notch is created as the air-bleeding hole 56 in the circuit board 52, their shapes are not limited to these examples. In a busbar unit 50a illustrated in FIG. 10, a notch is created as the injection port 55 in and a through-hole is created as the air-bleeding hole 56 leading to the receiving niche 515 in the circuit board 52.

Figure 11:
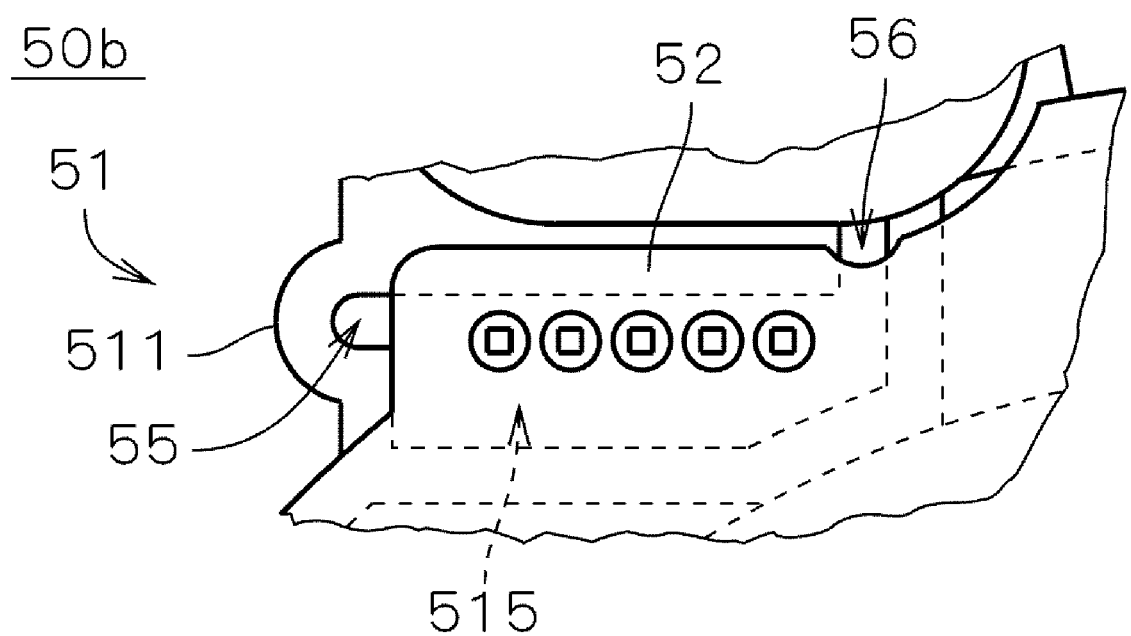
Figure 12:
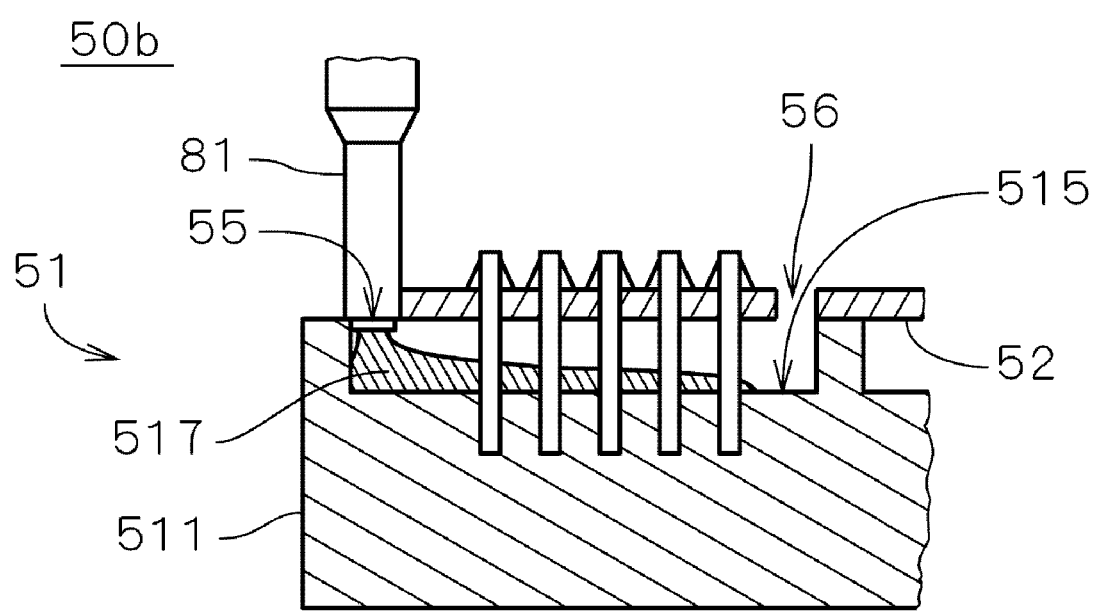
FIG. 12 is schematic, fragmentary, enlarged sectional view taken axially, illustrating a portion of the busbar unit in the embodiment of FIG. 11, and representing the injection of a sealant through an injection nozzle, depicted fragmentarily, into the receiving niche.

FIG. 11 is a plane view illustrating a part of an enlarged busbar unit 50b involving a third example and FIG. 12 is a vertical cross-sectional view of the busbar unit 50b illustrated in FIG. 11. In the busbar unit 50b, the busbar holder 51 is provided with the injection port 55 leading to the receiving niche 515, into which the sealant 517 is injected from the injection port 55 through the nozzle 81 until it is confirmed by viewing from the air-bleeding hole 56 that the sealant 517 is charged to seal the space defined by the circuit board 52 and the busbar holder 51 with the sealant 517.

Figure 13:
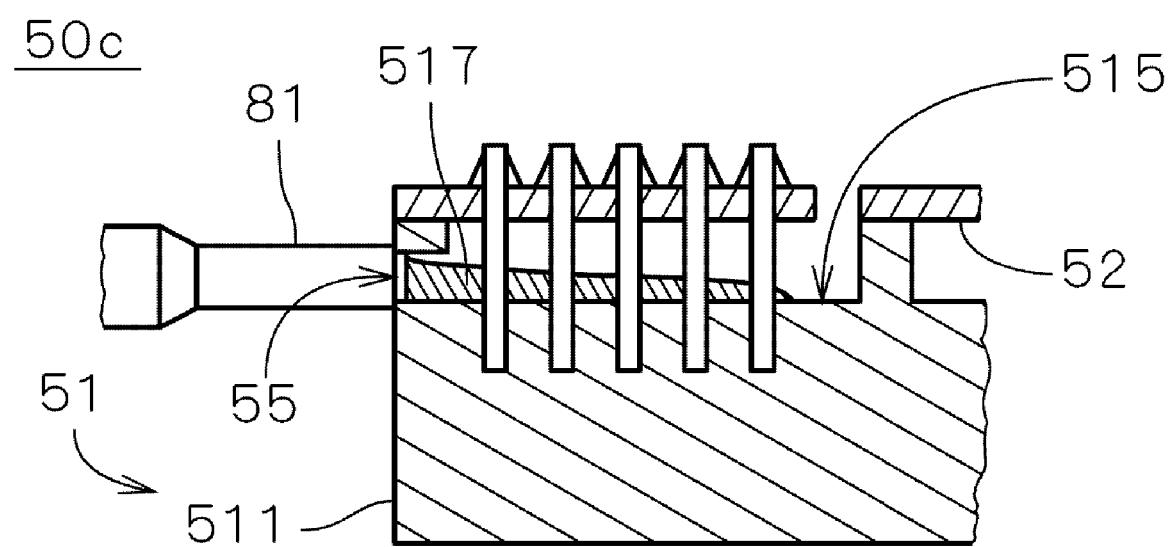
FIG. 13 is a view similar to that of FIG. 12, but illustrating a portion of a busbar unit into which a sealant is being injected in a different embodiment.

FIG. 13 is a vertical cross-sectional view illustrating a busbar unit 50c involving a fourth example. In the busbar unit 50c, on the lateral side or the busbar holder 51, a through-hole leading to the receiving niche 515 is created as the injection port 55, from which the sealant 517 is charged through the nozzle 81 into the receiving niche 515 to seal the space defined by the circuit board 52 and the busbar holder 51.

The busbar holder 51, however, dose not always require to create the receiving niche 515. If the receiving niche 515 is not created, an opening part of the space defined by the busbar holder 51 and the circuit board 52 may be employed as an injection port and air-bleeding hole (that is, the injection port and air-bleeding hole are not necessarily created independently, but any region may function as the injection port and air-bleeding hole). Of course, from the viewpoint of the proper injection of the sealant 517, an approximately enclosed space is preferably formed in the busbar holder 51.

As described in the foregoing, the injection port 55 and the air-bleeding hole 56 may be created in the circuit board 52, in the busbar holder 51 or between them in various manners. In addition, the shape of the injection port 55 and the air-bleeding hole 56 may be variously changed, and their shapes and locations are determined depending on the form of the circuit board 52 placed on the busbar holder 51, the type and number of electronic components mounted on the circuit board 52 and the patterns on the circuit board 52. In any case, the surface of the circuit board on the busbar holder 51 side can be coated with the sealant 517 to improve the reliability of the motor 1 and the pump. From the viewpoint of facilitating the creation of the injection port 55 and the air-bleeding hole 56, however, a through-hole and a notch are preferably created in the circuit board 52 as the injection port 55 and the air-bleeding hole 56.

Figure 14:
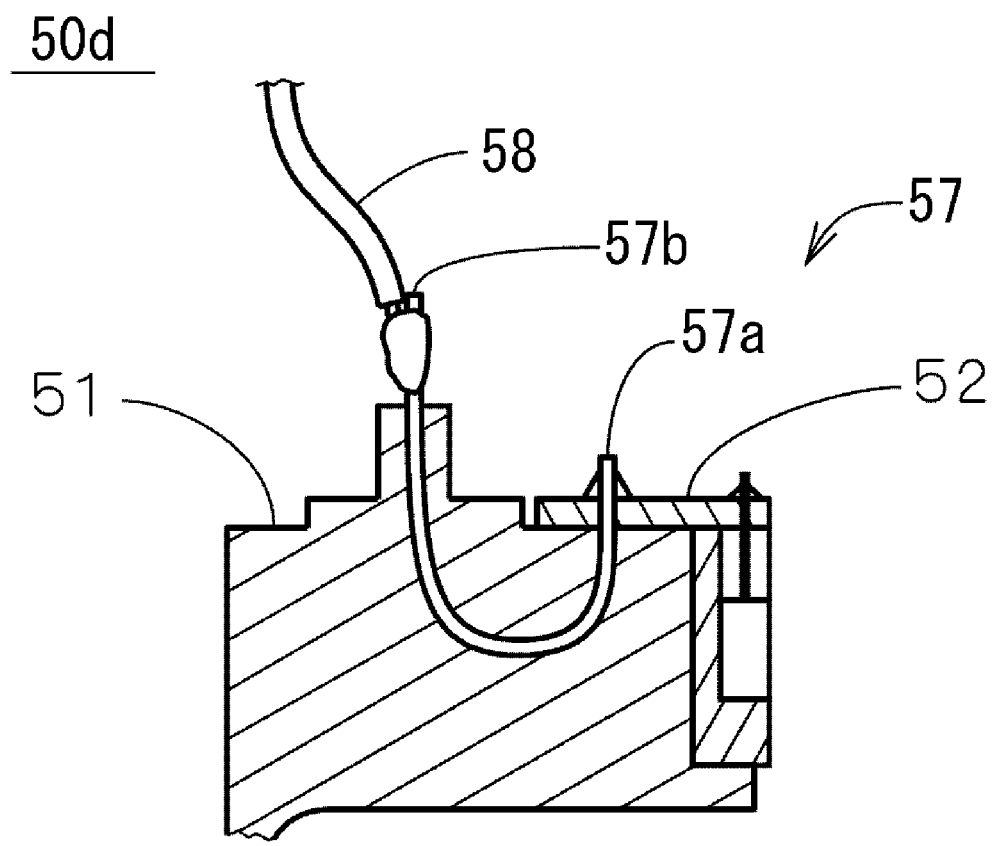
FIG. 14 is, like FIG. 3, a schematic, fragmentary, enlarged sectional view taken axially, but illustrating a portion of a busbar unit in yet a different embodiment of the present invention.
Figure 15:
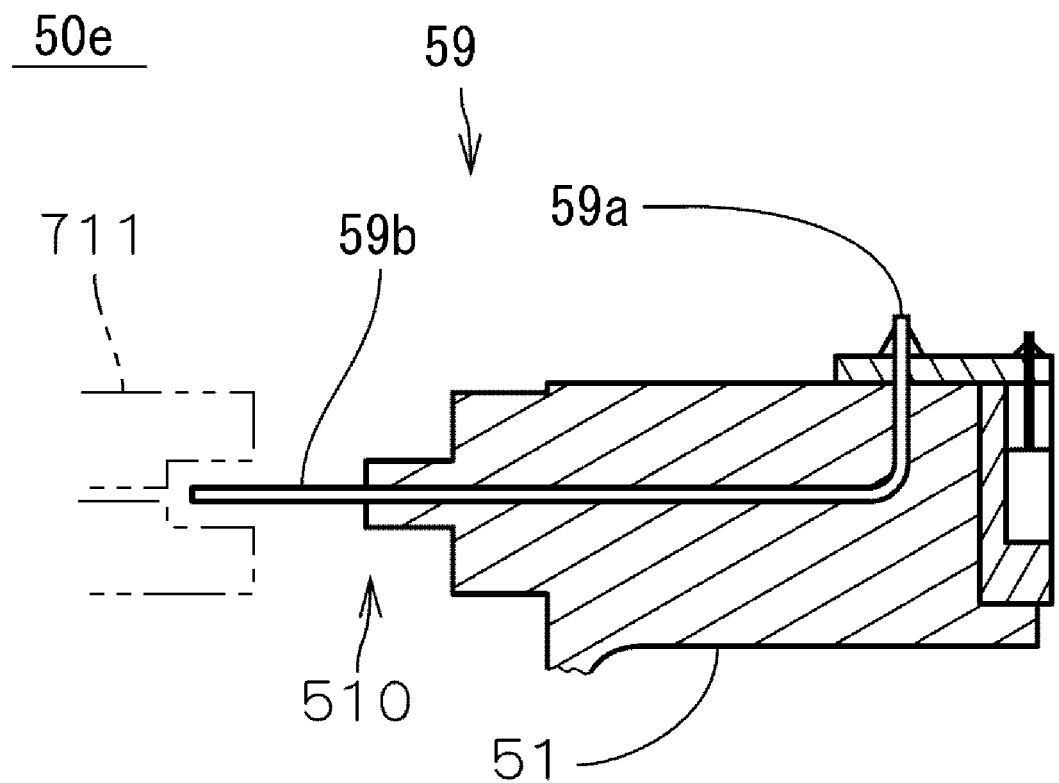
FIG. 15 is, also like FIG. 3, a schematic, fragmentary, enlarged sectional view taken axially, but illustrating a portion of a busbar unit in still a further embodiment of the present invention, with the external jack represented in phantom.

FIGS. 14 and 15, which are vertical cross-sectional views illustrating second examples of connecting pins and connectors of a busbar unit, correspond to FIG. 3. In the busbar unit 50d illustrated in FIG. 14, the both ends 57a, 57b of pins 57 (corresponding to the connecting pins 513 in FIG. 3) is exposed from the busbar holder 51, and a flexible lead wire 58 is connected to the ends 57b opposite to the ends 57a connected to the circuit board 52 by using solder. Likewise in the busbar unit 50d, the busbar holder 51 absorbs the force acting on the end 57b when connection such as wiring is established, specifically when the lead wire 58 is connected to the ends 57b and a connector (its illustration is omitted) coupled to the opposite end of the lead wire 58 is coupled to and decoupled from the ECU 71, to prevent stress from occurring in the joints between the ends 57a of the pins 57 and the circuit board 52. In this way, the pins provided as a second metal member inside the busbar holder 51 are not necessarily employed as connector pins. The second metal member is not necessarily pin-like if appropriately linear. For example, it may be twisted-wire possessing low stiffness.

FIG. 15 is a vertical cross-sectional view illustrating an example of a busbar unit 50e provided with L-shaped connecting pins 59. The connecting pins 59 illustrated in FIG. 15 are L-shaped, so that a board-side ends 59a are stuck out vertically from the top side of the busbar holder 51, while connector-side ends 59b are stuck out from its outer lateral side. And connector-side ends 58b and a region surrounding the connector-side ends 58b forms a part of holder connector 510 coupled to the external connector 711. In this way, the connecting pins 513, which are the second metal member in the busbar holder 51, may be variously shaped. For example, the connecting pins 513 may be linear.

While embodiments of the present invention have been explained in the foregoing, specific modes by which the present invention can be adopted are not limited to the above examples, so that they can be variously changed.

For example, even if other terminals (such as neutral terminals) protrude from the busbar 51 to be connected to the circuit board 52, the above-described method of injecting the sealant 517 is preferably employed to seal the terminals.

Furthermore for example, in the motor 1, while the busbar holder 51 of the busbar 50 is ring-like, it is not limited to such a shape. It may be arcuate or discoid.

In the embodiments described in the foregoing, although only the busbars 512 and the connecting pins 513 are molded through insert-molding in the busbar holder 51 as metal members, other metal members may be molded through the insert-molding.

Furthermore, the circuit board 52 may be provided on the sides of the busbar holder 51 other than its upper side, for example, on its lower side of the busbar holder 51.

The bearing mechanism 4 may be furnished bearings other than a pair of bearings 41, 42. For example, the shaft 21 may be suspended by oil-bearing sleeve. Furthermore, the shaft 21 dose not require to be retained by overhang structure, so it may be retained by center-impeller structure. That is, a bearing mechanism rotatably retaining the shaft 21 with respect to the housing 11 may be separated by the rotor core 22 into the top and bottom parts.

High reliability is ensured to the motor 1, so that it may be employed to an electric-powered braking system, an electromagnetic suspension, a transmission system other than electric power steering, as well as various systems for assisting driving operation of vehicles other than automobile. It is to be noted that the motor 1 may be employed to pumps for fluids other than oil. Additionally, if the motor 1 is not employed as a pump, the sealing explained in the forgoing improves the reliability of motor.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A busbar unit for placement on an upper side, with respect to a predetermined orientation of a center axis in an electric motor, of a motor armature, to establish an electrical linkage to supply drive current to the armature, the busbar unit comprising:
   a plurality of busbars having a plurality of terminals arranged to electrically connect the armature with an electric-current supply unit;
   a busbar holder arranged to retain a section of the plurality of busbars connected to the plurality of terminals, the busbar holder being made of an injection-molded non-conductive thermoplastic resin material; and
   a plurality of foot portions circumferentially spaced on the busbar holder and arranged to determine an axial position of the busbar holder with respect to the armature, one of the plurality of foot portions being disposed along a bottom side of the busbar holder at a circumferential location where the plurality of terminals are arranged to electrically connect to the electric-current supply unit, the plurality of terminals defining a connector plug arranged to plug into an external connector jack of the electric-current supply unit; wherein
   the plurality of terminals protrude upwards from a top of the busbar holder.

2. A busbar unit for placement on an upper side, with respect to a predetermined orientation of a center axis in an electric motor, of a motor armature, to establish an electrical linkage to supply drive current to the armature, the busbar unit comprising:
   a plurality of busbars having a plurality of terminals arranged to electrically connect the armature to an electric-current supply unit;
   a busbar holder arranged to retain a section of the plurality of busbars connected to the plurality of terminals, the busbar holder being made of an injection-molded non-conductive thermoplastic resin material;
   a plurality of metal connecting pins, first and second ends of each of the plurality of connecting pins extending from the busbar holder, with a portion of the connecting pins between the first and second ends being located in an interior of the busbar holder; and
   a plurality of foot portions circumferentially spaced on the busbar holder and arranged to determine an axial position of the busbar holder with respect to the armature, one of the plurality of foot portions being disposed along a bottom side of the busbar holder at a circumferential location of a protrusion extending upwards from the busbar holder; wherein
   the first ends of the plurality of connecting pins and a region of the busbar holder surrounding the first ends of the plurality of connecting pins define a portion of a connector plug arranged to plug into an external connector jack;
   the busbar holder has an approximately annular shape; and
   the second ends of the plurality of connecting pins are disposed radially inward of the region of the busbar holder.

3. The busbar unit as set forth in claim 2, wherein the plurality of connecting pins is integrally insert-molded in the busbar holder.

4. The busbar unit as set forth in claim 2, further comprising a sensor connected to the circuit board and arranged to detect a rotational position of a rotor section of the motor.

5. The busbar unit as set forth in claim 2 wherein:
   each of the second ends of the plurality of connecting pins is exposed so as to protrude substantially perpendicularly from the first side of the busbar unit; and
   a plurality of holes through which the second ends are respectively inserted is provided in the circuit board.

6. The busbar unit as set forth in claim 2, wherein the first ends of the plurality of connecting pins are arranged to be detachably/reattachably connected to the external connector jack.

7. The busbar unit as set forth in claim 2, wherein each of the plurality of connecting pins is approximately J-shaped.

8. A motor comprising:
   a busbar unit as set forth in claim 2;
   a stator section having an armature;
   a rotor section having a field magnet centered on a predetermined center axis and arranged to generate torque between the rotor section and the armature;
   a bearing mechanism centered on the center axis and arranged to rotatably support the rotor section with respect to the stator section; and
   a housing accommodating the stator section and the rotor section.

9. The busbar unit as set forth in claim 2, further comprising a circuit board disposed on a first side of the busbar holder and joined to each of the second ends of the plurality of connecting pins.

10. The busbar unit as set forth in claim 9, further comprising:
    a sealant between the busbar holder and the circuit board; and
    a receiving portion provided on the first side of the busbar holder and arranged to partially accommodate the connecting pins; wherein
    the circuit board abuts the busbar holder so as to cover the receiving portion; and
    at least a portion of the sealant is disposed in the receiving portion.

11. The busbar unit as set forth in claim 10, further comprising an electronic part mounted on a surface of the circuit board opposing the busbar holder, wherein the electronic part is also accommodated in the receiving portion.

12. A busbar unit for placement on an upper side, with respect to a predetermined orientation of a center axis in an electric motor, of a motor armature, to establish an electrical linkage to supply drive current to the armature, the busbar unit comprising:
    a plurality of busbars having a plurality of terminals arranged to electrically connect the armature to an electric-current supply unit;
    a busbar holder arranged to retain a section of the plurality of busbars connected the plurality of terminals, the busbar holder being made of an injection-molded non-conductive thermoplastic resin material;

a plurality of metal connecting pins, first and second ends of the plurality of connecting pins extending from the busbar holder, with a portion of the connecting pins between either the first and second ends being located in an interior of the busbar holder;

a circuit board disposed on a first side of the busbar holder and joined to each of the second ends of the plurality of connecting pins;

a sealant in between the busbar holder and the circuit board; and a receiving portion provided on the first side of the busbar holder and arranged to partially accommodate the connecting pins; wherein the circuit board abuts the busbar holder so as to cover the receiving portion; and at least a portion of the sealant is disposed in the receiving portion.

13. The busbar unit as set forth in claim 12, further comprising an electronic part mounted on a surface of the circuit board opposing the busbar holder, wherein the electronic part is also accommodated in the receiving portion.

14. The busbar unit as set forth in claim 12, further comprising:

a sensor having terminals electrically connected to the circuit board, the sensor arranged to detect a magnetic-pole position of a rotor section of the electric motor when opposed to an outside surface of the rotor section;

a sensor holder fixed to at least one of the busbar holder or the circuit board, the sensor holder having a recess opening toward the outside surface of the rotor section, and the sensor holder arranged to retained the sensor; wherein a portion of the sealant is disposed in a space between the sensor and the circuit board.

15. The busbar unit as set forth in claim 12, wherein the sealant is located on a surface of the circuit board fixed to the first side of the busbar holder.

16. The busbar unit as set forth in claim 12, further comprising an injection port through which the sealant is injected, the injection port being provided in the circuit board, in the busbar holder, or between the circuit board and the busbar holder.

17. The busbar unit as set forth in claim 16, wherein the injection port includes a through-hole or a notch in the circuit board.

18. The busbar unit as set forth in claim 17, further comprising an aperture separate from the injection port, the aperture provided in the circuit board, in the busbar holder, or between the circuit board and the busbar holder.

19. The busbar unit as set forth in claim 18, wherein the aperture includes a through-hole or a notch in the circuit board.

* * * * *